United States Patent [19]

Kuchta

[11] 3,785,817

[45] Jan. 15, 1974

[54] TRANSFER OF PHOTOPOLYMER IMAGES BY IRRADIATION

[76] Inventor: August Dennis Kuchta, 20 Rolling Road, East Brunswick, N.J. 08816

[22] Filed: Oct. 5, 1970

[21] Appl. No.: 78,180

[52] U.S. Cl. .................................... 96/28, 96/35.1
[51] Int. Cl. .......................................... G03c 11/12
[58] Field of Search ........................................ 96/28

[56] References Cited

UNITED STATES PATENTS

| | | | |
|---|---|---|---|
| 3,353,955 | 11/1967 | Colgrove | 96/28 |
| 3,380,825 | 4/1968 | Webers | 96/28 |
| 3,481,736 | 12/1968 | Ruff | 96/28 |
| 3,615,435 | 10/1971 | Chu | 96/115 P |
| 3,615,567 | 10/1971 | Wilson | 96/115 P |

*Primary Examiner*—J. Travis Brown
*Assistant Examiner*—John L. Goodrow
*Attorney*—James T. Corle

[57] ABSTRACT

This invention relates to a process of imaging a surface by means of a transfer method utilizing an imaged photopolymerizable film element. The imaged element may be derived from a film element which comprises a photopolymerizable layer on a support and having a removable cover sheet laminated to the surface of said layer opposite from said support. Such elements comprise a dry photopolymerizable layer which is coated from a composition comprising a mixture of a particulate microcrystalline thickener having a particulate size no greater than .0001-inch, an ethylenically unsaturated monomer and an initiating system, and containing a sufficient amount of monomer to cause a thin film of substantially free monomer to form on the monomer-thickener layer upon drying. The layer will generally contain from 10–90 parts by weight of thickener per 100 parts by weight of monomer-thickener. The layer has optical density in the actinic region not more than 0.7 and a thickness of at least 0.00005-inch. The coplanar complementary polymerizable image remaining on the support, after imagewise exposure and removal of the cover sheet and exposed image, can be transferred to a receptor surface by laminating it to a receptor sheet and then exposing the layer to actinic radiation through the base or the receptor sheet of said element, if said sheet is transparent to the radiation.

7 Claims, No Drawings

TRANSFER OF PHOTOPOLYMER IMAGES BY IRRADIATION

BACKGROUND OF THE INVENTION

1. Field of the Invention

This invention relates to a process of image reproduction by image transfer methods utilizing imaged photopolymerizable elements.

2. Description of the Prior Art

There are various processes for image reproduction which are useful in producing a copy of an image by photopolymerization techniques. Closely related to the present invention is Colgrove, U.S. Pat. No. 3,353,955 issued Nov. 21, 1967. This patent discloses a process of forming an image from a photopolymerizable layer laminated between a support and a cover sheet. The element is characterized by the fact that the cover sheet and support film have differential adhesions for polymerized and unpolymerized coplanar complementary areas. Preferably the photopolymerizable layer has an optical density of 0.8 or more. The film element is exposed imagewise through the support to a positive image to give a polymerized negative image on the support and an unpolymerized positive image on the cover sheet. Differential adhesions of cover sheet and support are accomplished by using a polyethylene terephthalate film for the support on which the photopolymerizable composition is coated and a film having a matte surface as the cover sheet.

An improvement over the Colgrove process is described in Jeffers U.S. Pat. No. 3,408,191, dated Oct. 29, 1968. The process of the Jeffers Patent comprises exposing the Colgrove element or a laminated element having like supports with the photopolymerizable stratum therebetween, first from one side of the element with an imagewise exposure to actinic radiation, and then from the opposite side with an overall or half-tone screen exposure to actinic radiation. The laminated element is then peeled apart to give clear, sharp images on each of the supports, a complementary image of the original being adhered to the support nearest the imagewise exposing radiation and an image of the original on the support farthest from said imagewise exposing radiation.

Assignee's Kuchta application Ser. No. 762,627, filed Sept. 25, 1968 now abandoned, describes an element for and a process of image transfer which requires high pressures as the sole means of adhering the image to the receptor surface.

Another related case is Chambers, U.S. Ser. No. 563,367, filed July 7, 1966 now U.S. Pat. No. 3,525,615. Chambers discloses a photopolymerizable element and process by which it is used. They both employ an ethylenically unsaturated photopolymer composition and a photoinitiator in addition to an inorganic thixotropic binder. The element is exposed imagewise and image transfer is achieved by placing the element in intimate contact with an image-receptive support. Direct force is then applied to the laminated structure causing liquefaction of the photopolymerizable material in the unexposed areas and transfer to the receptor is achieved.

Heiart, U.S. Pat. No. 3,202,508, Aug. 24, 1965, discloses a photopolymerization process of image reproduction at room temperature but relies on pressure to obtain cohesive failure between the polymerized and unpolymerized material to separate the positive from the negative image. The systems of Chambers and Heiart present a problem in trying to maintain dimensional fidelity. Furthermore, the transferred image remains tacky and special precautions must be taken so that the unpolymerized transferred image is not destroyed or distorted.

The above patents and applications relate to a photopolymer system and in some way are related to image reproduction.

SUMMARY OF THE INVENTION

The present invention is similarly related, however, it is directed to providing a new and improved process, particularly suitable for use in making resists on etchable surfaces, e.g., printed circuits, decalcomanias, and in color-proofing. The principal value lies in utilizing unpolymerized image areas of the elements described in the above patents or applications after the delamination step. This step gives both a negative and a positive image because of separation of exposed and unexposed areas of the photopolymerizable layer after exposure. The unpolymerized image areas is transferred to a receptor by laminating thereto, irradiating the element through the base or through the receptor if it is transparent and separating. This permits the transfer of multiple images of complementary colors to be superimposed on one image receptor, thereby providing a system for colorproofing. It also permits transfer of an image to an etchable surface to form a resist.

PREFERRED EMBODIMENT

A photopolymerizable film element useful for image reproduction according to the process of this invention is that described in the said Kuchta Application and comprises a laminated structure having a photopolymerizable composition coated on a support and having a cover sheet laminated to the surface of the coating. The photopolymerizable coated layer has a dry thickness of at least 0.00005-inch and contains a nongaseous, ethylenically unsaturated monomer with at least one terminal ethylenic group capable of forming a high polymer by free radical initiated and chain-propagated, addition polymerization and an optical density when exposed to actinic radiation equal to or less than 0.7. This is combined with a thickener, the monomer being present in an amount sufficient to form a thin film of substantially free monomer on the surface of the monomer-thickener layer upon drying. The support and cover sheet are characterized as having different surface chemical or physical affinities for the photopolymer layer which results in different adhesive responses to polymerized and unpolymerized materials. The polymerized material adheres to the cover sheet which has the higher chemical and/or physical affinity for the photopolymerized material and the unpolymerized material adheres to the support which has the lower chemical affinity for the polymerized material producing a positive and a negative image. This is believed to be due to the fact a thin film of substantially free monomer forms on the surface of the monomer-thickener layer upon drying of the layer. When unexposed, this thin film is weak cohesively and separates upon removal of the cover sheet leaving the photosensitive layer on support. However, upon exposure, polymerization takes place in the thin film, whereby it becomes cohesively strong and separation occurs at the interface with the support. After the polymerized material is peeled apart from the unpolymerized material, the unpolymerized image material left on the support is transferred to a receptor surface, such as a metal sheet or a film having a higher chemical affinity for the exposed photopolymer layer than said support, or paper which has a higher physical and chemical affinity for the exposed photopolymer layer than said support. These affinities may be determined by measuring the contact angle of a drop of the monomer on the surface contacting the photopolymerizable layer. A lower contact angle indicates a higher affinity for the exposed photopolymer layer.

The film structure may be made in the following manner: The photopolymerizable composition may embody an ethylenically unsaturated compound containing at least one terminal ethylenic group, as exemplified by the monomers described in Plambeck, U.S. Pat. No. 2,760,863; Celeste and Bauer, U.S. Pat. No. 3,261,686; or Cohen and Schoenthaler, U.S. Pat. No. 3,380,831. In addition to the monomers in the working examples, one can use ethylene glycol diacrylate and dimethacrylate, diethylene glycol diacrylate, glycerol diacrylate and triacrylate, 1,3-propanediol diacrylate and dimethacrylate, 1,2,4-butanetriol trimethacrylate, 1,3-cyclohexanediol diacrylate, 1,4-benzenediol dimethacrylate, pentaerythritol tetraacrylate and tetramethacrylate, and 1,5-pentanediol diacrylate and dimethacrylate.

In addition to the organic polymer thickneres of the working examples, there can be used: thickeners 1. Vinylidene chloride copolymers, e.g., vinylidene chloride/acrylonitrile, vinylidene chloride/methyl methacrylate and vinylidene chloride/vinyl acetate,
2. Ethylene/vinyl acetate copolymers,
3. Cellulose ethers, e.g., methyl, ethyl, and benzyl cellulose
4. Synthetic elastomers, e.g., butadiene/acryonitrile copolymers, chlorinated isoprene, and chloro-2-butadiene-1,3-polymers,
5. Polyvinyl esters, e.g., polyvinyl acetate/acrylate, polyvinyl acetate/methyl methacrylate, and polyvinyl acetate,
6. Polyacrylate and polyalkylacrylate esters, e.g., polymethyl methacrylate and polyethyl methacrylate, and
7. Polyvinyl chloride and copolymers, e.g., vinyl chloride/vinyl acetate.

The ethylenically unsaturated monomer should have a molecular weight of at least 150 and be non-volatile at room temperature and be present in the ratio of from 10 to not more than 90 parts by weight of monomer per 100 parts by weight of monomer-thickener composition. The thickeners useable in this system may be particulate microcrystalline thickeners having a preferred particle size no greater than 0.0001-inch and form hetergeneous systems with the monomer. The thickener may also be a macromolecular polymer.

The photopolymer composition may also contain particulate material, such as a pigment or it may contain a dye to serve as a colorant, usually present in the amount of 1–60 parts by weight of pigment per 100 parts by weight of pigment-monomer.

In addition, free radical generating polymerization initiator activatable by actinic radiation is present in the composition in the amount of 0.001 to 20 parts by weight of the monomer.

In the process of image reproduction (a) the photopolymerizable film element is imagewise exposed to actinic radiation, (b) the exposed element is delaminated, whereby the polymerized material adheres to the cover sheet having the higher chemical or physical affinity and the unpolymerized material adheres to the support having the lower chemical or physical affinity.

A receptor having a higher chemical or physcial affinity for the photopolymerized layer than the support, as indicated by measuring the contact angle of drops, is laminated to the unpolymerized material on the support. The element is then irradiated through the support or through the receptor sheets if they are transparent and delaminated to give a good, hard, glossy image on the receptor. No photopolymer remains on the support.

This invention will be further illustrated, but is not intended to be limited by the following detailed examples.

EXAMPLE I

A composition was made up containing the following ingredients:

Colloidal Aluminum Oxide (Particle size 5 × 75mμ) — 25.2 g.
Water — 114.0 g.
Trimethylolpropane ethylene oxide triacrylate adduct (Prepared according to Cohen et al., U.S. Pat. No. 3,380,831, 4/30/68) — 160.0 g.
Pigment-Aniline Black C.I. 50440 — 48.0 g.
2-Ethylanthraquinone — 9.2 g.
Acrylated 1:1 glycidyl Methacrylate/Acrylonitrile copolymer — 45.0 g.
Ethanol — 400.0 g.

The above ingredients were milled for 16 hours in a porcelain ball mill (½ gallon jars containing 1,000 grams ½ inch diameter porcelain balls). The milled mixture was coated on a biaxially oriented polypropylene film having a thickness of 0.001 inch. The coating was dried at 180°F. to give a dry thickness of about 0.0001 inch and then laminated with a polyethylene terephthalate film cover sheet having a thickness of 0.001 inch. The element had an optical density of 0.6 at 3500A. Measurements with a Gaertner goniometer of drops of the monomer, trimethylolpropane ethylene oxide triacrylate adduct on polypropylene film gave a contact angle of 45°, and on polyethylene terephthalate film a contact angle of 16°. The film element was exposed to a halftone positive image through the polyethylene terephthalate cover sheet. An exposure of 1 minute was made in a vacuum printing frame of 27 inches of vacuum at a distance of 18 inches from a carbon arc by means of an exposing device identified as a "nuArc Plate Maker (flip-top)" manufactured by the nuArc Company, Chicago, Ill. The element was then delaminated and the unexposed part of the layer remained on the polypropylene support and the exposed areas of the layer were removed with the cover sheet. The polypropylene support with its unexposed unpolymerized iamge layer was then placed against a 0.001 inch polyethylene terephthalate film receptor and laminated with light pressure (approximately 25 lbs. per square inch) by means of a rubber hand-roller. The lement was placed in vacuum frame described above and exposed for 2 minutes through the receptor sheet and the element was delaminated with the irradiated image being transferred to the receptor and the polypropylene film being free of photopolymer material. The transferred image was hard and not easily scratched and of good quality. If desired the transfer exposure could be performed through the base and equivalent transfer would occur. This transfer constitutes a process of writing on a plastic.

EXAMPLE II

A coating composition was prepared from the following ingredients:

Colloidal aluminum oxide — 6.8 g.
Bentonite clay — 18.0 g.
Trimethylolpropane ethylene oxide triacrylate adduct — 68.0 g.
2-Ethylanthraquinone — 1.7 g.
p-Methoxyphenol — 1.7 g.
Saponin — 3.1 g.
Alkyl sodium salt of naphthalene sulfonic acid (surfactant) — 3.4 g.
Rhodamine Pigment C.I. 45160 — 10.2 g.
Water — 500.0 g.
Isopropanol — 25.0 g.

The above composition was milled, coated, dried, laminated to a polyethylene terephthalate film cover sheet, and exposed as described in Example I. The element had an optical density of 0.5 at 3500A. The exposed element was delaminated and then the support with the unexposed image was laminated to a sheet of cellophane using a hand roller as in Example I, and the element exposed through the cellophane for 2 minutes with the exposing apparatus described in Example I. A drop of the monomer on cellophane gave a contact angle of 37°. After delamination, the polypropylene was removed, leaving a good high quality glossy, hard, magenta image on the cellophane sheet. Such a transferred image is useful for decorating or illustrating cellophane wrapping materials.

EXAMPLE III

The above mixture of Example II was ball-milled, coated on a polypropylene film, dried, to give a layer having a thickness of 0.0001 inch and an optical density of 0.5 at 3,500A. It was laminated with a polyethylene terephthalate cover film, exposed through the polypropylene base and delaminated. The unpolymerized photopolymer layer on the polypropylene support was then laminated as in Example I to a paper sheet having a layer of gelatin coated thereon. The contact angle for the paper was about 10° with the monomer. The element was then irradiated with the carbon arc for 2 minutes, as described in Example I, and the polypropylene support was stripped off, leaving a good, hard, magenta image on the paper sheet which was suitable for colorproofing.

EXAMPLE IV

The formula of Example II containing Yellow C.I. 21090 in place of Rhodamine was coated, dried, laminated, exposed to a yellow separation positive through the polypropylene base and delaminated. The layer had an optical density of 0.4 at 3500A. The unpolymerized image was then laminated to a receptor sheet of polyethylene terephthalate film and the element irradiated for 2 minutes as described in Example I. The polypropylene was then stripped off leaving a yellow image on the receptor film. The formula of Example II was coated, dried, laminated, exposed to a magenta separation positive and delamianted as described for the above yellow image. The resulting nonpolymerized magenta layer on the polypropylene support was laminated in register onto the receptor containing the yellow image. The element was again irradiated for 2 minutes and the polypropylene support was stripped off, leaving a two-color image on the receptor. This was repeated using a gelatin coated paper as the receptor and again a good two-color image was formed on the paper sheet useful in the colorproofing art.

EXAMPLE V

Example II was repeated except that a smooth offset lithographic paper (Kromekote paper manufactured by Champion Paper Co.) was used as a receptor sheet. An excellent reproduction of the original image was left on the paper receptor which was equal to a high quality image obtained by making up and printing an image by conventional lithographic methods. This demonstrates a unique and economical method for making reproduction proofs in a simple manner without having to resort to the complicated and costly lithographic procedures now being used in the art.

EXAMPLE VI

A coating composition was made using the following ingredients:

Colloidal aluminum oxide — 40.0 g.
Trimethylolpropane ethylene oxide triacrylate adduct — 150.0 g.
2-Ethylanthraquinone — 4.0 g.
Silicon dioxide — 4.0 g.
Saponin — 1.5 g.
Alkyl sodium salt of naphthalene sulfonic acid (surfactant) — 6.0 g.
Rhodamine Pigment C.I. 45160 — 15.0 g.
Water — 650.0 g.
Isopropanol — 120.0 g.

The above mixture was milled and coated on a polypropylene film and dried to give a dry layer thickness of about 0.0001 inch and an optical density of 0.5 at 3500A. The layer was laminated to a 0.0001-inch thick polyethylene terephthalate film and exposed through the polypropylene to a positive image and delaminated. The polypropylene film with the unexposed photopolymer layer was then laminated to a lithographic paper of the rough offset type (FOTOLITHE OFFSET PAPER manufactured by the Warren Paper Company) and irradiated as described above. Pressure from a hand roller (approximately 25 lbs/inch) was insufficient to cause good adherence of the image to the paper because of the rough texture of said paper. It was laminated by the pressure of the impact of metal balls (approximately 10,000 lbs./in.) carried out for 4 minutes in the apparatus described in Halpern, U.S. Pat. No. 3,244,777. Transfer by pressure alone results in a soft image and complete transfer of photopolymer does not take place. Upon irradiation for 2 minutes by a carbon arc as described in Example I and delamination of the polypropylene support, complete transfer occurred, and an excellent image remained on the paper. This further demonstrates a unique, simple, and economical method of making reproduction proofs.

EXAMPLE VII

A coating composition was prepared from the following ingredients:

Colloidal aluminum oxide — 42.0 g.
Trimethylolpropane ethylene oxide triacrylate adduct — 190.0 g.
2-Ethylanthraquinone — 4.4 g.
Silicon dioxide — 4.0 g.
Saponin — 3.0 g.
Rhodamine Pigment C.I. 45160 — 15.0 g.
Alkyl sodium salt of naphthalene sulfonic acid (surfactant) — 6.0 g.
p-Methoxyphenol — 7.0 g.
Water — 600.0 g.
Isopropanol — 90.0 g.

The above mixture was ball milled, coated on a 0.001-inch polypropylene film and dried as in Example I. The layer was then laminated to the metal surface of a polyethylene terephthalate film which had been vapor metallized with a thin layer of aluminum on one side thereof. The element was exposed to a positive image through the polypropylene support; and after delamination, the unexposed photopolymer image remaining on the support was laminated with hand roller pressure to a receptor which was a 0.004 inch thick drafting film of the type described in Assignee's Van Stappen, U.S. Pat. No. 2,964,423 dated Dec. 13, 1960. The laminated element was irradiated for 2 minutes, as described in Example I, and then delaminated to leave a good, glossy, hard image on the drafting film. This represents a method of reproducing line drawings on an ink-receptive surface.

EXAMPLE VIII

Example VII was repeated except that an aluminum metal sheet was used as the receptor and the irradiation time through the polypropylene support was for 5 minutes. Upon delamination a good quality hard image was adhered to the aluminum sheet. The resulting element could be used as a lithographic printing plate in an offset printing press.

EXAMPLE IX

A nonpigmented coating composition was made of the following ingredients:

Colloidal aluminum oxide — 42.0 g.
Trimethylolpropane ethylene oxide triacrylate adduct — 150.0 g.
2-Ethylanthraquinone — 6.0 g.
Silicon dioxide — 4.0 g
Saponin — 3.0 g.
Alkyl sodium salt of naphthalene sulfonic acid (surfactant) — 6.0 g.
p-Methoxyphenol — 3.0 g.
Water — 600.0 g.
Isopropanol — 90.0 g.

The above mixture was coated on 0.001-inch polypropylene film, dried, and laminated to the metal surface of an aluminized polyethylene terephthalate film and exposed to a positive image as described in Example VII. After exposure and delamination, the clear unpolymerized image on the polypropylene support was placed in contact with a sheet of the lithographic paper used in Example VI and laminated by means of the impact of metal balls, as described in that Example. The laminated element was irradiated by means of the carbon arc through the polypropylene support and then the support was removed leaving a hard colorless image on the paper support. The colorless image could be pigmented by hand coloring for creative art and advertising purposes.

EXAMPLE X

To 50 milliliters of the composition of Example IX there was added 100 milliliters of a 27 percent aqueous solution of Benzidene Yellow Dye C.I. 21090. The mixture was coated on a polypropylene support and all of the operations of Example IX were carried out to give a good, hard, glossy yellow image on the lithographic paper suitable for the yellow record of a color proof.

EXAMPLE XI

Example VII was repeated except that in place of the drafting film as the receptor, a paper treated with a cellulose nitrate lacquer was used. A 5-minute irradiation to the carbon arc lamp was made and the element was delaminated to give a good hard image on the lacquered paper.

EXAMPLE XII

Example VII was repeated except that a clear polyethylene terephthalate film was used as a receptor. It was laminated to the unexposed photopolymer image on the polypropylene support and before irradiating the element there was contacted with the back surface of the receptor the metal surface of the aluminized film used in Example VII as the cover sheet. The element and metallized film were placed in a vacuum form and irradiated for 15 sec., as described in Example I. Upon delamination of the element, a good, glossy hard image was obtained on the clear polyethylene terephthalate film. Without the metallized backing film the irradiating time required to get a good hard image on transfer was 2 minutes.

EXAMPLE XIII

The following ingredients were milled as described in Example I:

Colloidal aluminum oxide — 42.0 g.
Trimethylolpropane ethylene oxide triacrylate adduct — 160.0 g.
2-Ethylanthraquinone — 4.0 g.
Silicon dioxide — 4.0 g.
Saponin — 3.0 g.
Alkyl sodium salt of naphthalene sulfonic acid (surfactant) — 12.0 g.
Isopropanol — 90.0 g.
Water — 500.0 g.

To the above milled mixture there was added a dispersion containing 83 grams of water, 8.3 grams of Phthalocyanine Pigment C.I. 74160 and 8.3 grams of nonyl phenyl polyethoxy ethanol. The mixture was coated on a 0.001-inch polypropylene film to give a layer having an optical deisty of 0.6 at 3,500A. The layer was laminated to the metal surface of an aluminized polyethylene terephthalate film, as described in Example VII. After exposure and delamination, the soft unpolymerized layer was laminated to a polished steel metal plate having a thickness of 0.030-inch and the photopolymer layer irradiated through polypropylene base. The irradiation time was 3 minutes, giving a good hardened image adhering to the metal support.

This was repeated, except that the steel plate was coated with an enamel surface. Again, image transfer occurred to the metal. This type transfer would be useful in metal decorations, etching, or printing.

EXAMPLE XIV

The coating composition of Example VII was applied to a polypropylene support and all operations up to the point of laminating to a receptor were carried out as in that Example. The element was laminated to a paper treated with cellulose lacquer and with the laminated receptor sheet in place the element was placed in an atmosphere of nitrogen for about 10 seconds and irradiated with the carbon arc for 3 minutes. Upon delamination, a very hard image adhered to the lacquered paper and none of the photopolymer material remained on the polypropylene support. Transfer in an inert medium (nitrogen or carbon dioxide) eliminates need for a vacuum.

EXAMPLE XV

The composition of Example X was coated on a polypropylene film support and a 0.001-inch polyethylene terephthalate film was laminated to the surface of the photopolymer layer. The element was exposed for 2 minutes through a photographic negative separation of the yellow record in the exposing apparatus described in Example I. The element was delaminated leaving a hardened positive yellow image on the polyethylene terephthalate cover sheet. A second polypropylene support was coated with the composition of Example II which contains the magenta dye, Rhodamine. The polyethylene terephthalate cover sheet containing the yellow image was laminated to the surface of the magenta colored layer and the element was exposed for 2 minutes through the polypropylene support with a magenta separation record negative. Upon delamination, a two-color yellow and magenta image remained on the cover sheet. Another sheet of polypropylene was coated with the composition of Example XII containing the cyan dye, Phthalocyanine Pigment. The 2-color cover sheet was laminated to the surface of the cyan photopolymer layer and the element was exposed for 2 min. through the support with a cyan separation negative and delaminated to give a 3-color image on the cover sheet. The process was repeated by coating a polypropylene film with the composition of Example I which contains the pigment. The 3-color image was adhered to the black layer on the film. After exposure with a black separation negative for 2 min., a 4-color print on the sheet results.

EXAMPLE XVI

A composition was made up containing the following ingredients:

| | Grams |
|---|---|
| Methylene chloride | 40.0 |
| Pentaerythritol triacrylate | 13.9 |
| 2-tertiary-Butylanthraquinone | 0.14 |
| Chlorinated rubber (Parlin S-5) (67% Chorine — natural rubber — 20% solution in toluene at 25°C. has a viscosity of 4–7 centapoises) | 7.0 |
| Triethylene glycol diacetate | 0.2 |
| Victoria Blue (C.I. 44045) dye | 0.1 |

The ingredients were mixed until the solids dissolved and then the resulting solution was coated on a clear biaxially oriented polyethylene terephthalate film support having a thickness of 0.001-inch. The coating was air dried to give a dry layer thickness of about 0.0002-inch. The layer had an optical density of about 0.5 at 3500A.

The coating was laminated at room temperature to a copper clad polyethylene terephthalate film at a pressure of 25 pounds per square inch. The laminated element was given an image exposure through the clear film support for 2 minutes in a vacuum printing frame of 27 inches of vacuum at a distance of 18 inches from a carbon arc by means of an exposing device described in Example I. The clear film support was delaminated and the unexposed part of the layer remained on the clear polyethylene terephthalate film and the exposed areas were removed with the copper-clad film laminate. The copper-clad film laminate was then etched in 42° B. aqueous ferric chloride to give an excellent flexible printed circuit. The unexposed complementary image on the clear film support was pressure laminated (at 24 pounds per square inch) onto a receptor of smooth offset lithographic paper (Kromekote paper manufactured by the Champion Paper Corporation). The element was placed in the carbon arc exposing device of Example I and flash-exposed for 2 minutes. After exposure, the clear film support was removed, leaving the irradiated image on the paper receptor and the clear film free of photopolymer material. The transferred image was hard and glossy and useful for color-proofing.

EXAMPLE XVII

A coating composition was prepared from the following ingredients:

| | Grams |
|---|---|
| Pentaerythritol triacrylate | 160.0 |
| Chlorinated Rubber (as in Example XVI) | 64.0 |
| 2-tertiary-Butylanthraquinone | 8.8 |
| Triethylene glycol diacetate | 9.6 |
| 2,2'-methylene-bis(4-ethyl-6-t-butyl phenol) | 9.6 |
| Polymethyl methacrylate (inherent viscosity: 0.20 – 0.22 for a solution of 0.25 gram in 50 mls. Chloroform, at 20°C., using a No. 50 Cannon-Fenske Viscosimeter) | 7.8 |
| Carbon black | 0.3 |
| Trichloroethylene | 2080.0 |

The ingredients were mixed thoroughly and coated on a 0.001-inch thick clear polyethylene terephthalate film and dried at room temperature. The optical density of the layer was 0.6 at a wavelength of 3500A. To the surface of the coated layer there was laminated to aluminized polyethylene terephthalate. The element was exposed through the clear support for 12 seconds in the exposing device of Example I and delaminated, leaving a polymerized image on the aluminized film which was suitable as a name plate.

An unpolymerized complementary image remained on the clear film support. This image was pressure laminated to the lithographic paper, as in Example I, and flashexposed for 2 minutes in the carbon arc exposing device. Upon delamination of the clear film support, a good, hard, glossy image adhered to the paper support.

EXAMPLE XVIII

The following ingredients were milled, as described in Example I:

| | Grams |
|---|---|
| Microcrystalline cellulose | 3.0 |
| Trimethylolpropane ethylene oxide triacrylate adduct | 10.0 |
| 2-Ethylanthraquinone | 0.2 |
| Saponin | 0.3 |
| Alkyl sodium salt naphthalene sulfonic acid (Surfactant) | 0.3 |
| Phthalocyanine pigment (C.I. 74160) | 0.5 |
| Isopropanol | 8.0 |
| Water | 30.0 |

The resulting composition was coated on a 0.001-inch polypropylene film and dried to give an optical density of 0.6 at 3500A.

The layer was then laminated to a metal surface of a 0.002-inch thick polyethylene terephthalate film which had been vapor metallized with a thin layer of aluminum. The element was exposed to a positive image through the propylene support; and after delamination, the unexposed photopolymer image remaining on the support was laminated to a sheet of the lithographic offset paper described in Example VI. Upon irradiation and delamination, a good, hard, image adhered to the paper.

EXAMPLE XIX

A composition was made by mixing the following ingredients for 30 minutes using a laboratory type magnetic stirrer:

| | Grams |
|---|---|
| Chlorinated rubber (See Example XVI) | 64.0 |
| Polymethyl methacrylate (Inherent Viscosity: 0.20 -0.22 for a solution of 0.25 gram in 50 mls. chloroform at 20°C. using a No. 50 Cannon-Fenske Viscosimeter) | 7.8 |
| Pentaerythritol triacrylate | 160.0 |
| 2-t-Butylanthraquinone | 8.8 |
| Triethylene glycol diacetate | 9.6 |
| 2,2'Methylene-bis(4-ethyl-6-t-butylphenol) | 9.6 |
| Carbon black | .3 |
| Trichloroethylene | 2080.0 |

The mixture was skim coated on a polyethylene terephthalate film having a thickness of 0.001-inch and dried at 120°F. to give a dried layer having a thickness of about 0.0002-inch and an optical density of 0.6 at 3500A. There was laminated to the surface of the coating the aluminized polyethylene terephthalate film described in Example VII. The resulting element is exposed for 12 seconds in the exposing device described in Example I and delaminated. The unexposed image remaining on the clear film support was laminated to a lithographic paper at a pressure of 25 lbs. per square inch and irradiated as described in Example I. The irradiated photopolymer image hardened and adhered to the paper so that when the film support was removed a good, high quality image remained on the paper.

In addition to the hand roller and the steel ball bombardment apparatus described in the Examples, other laminating devices may be used such as a finger-pressure device described in Alles, U.S. Pat. No. 3,128,498 dated Apr. 24, 1962 or a nail pad as described in Nacci, U.S. Pat. No. 3,179,975, dated Apr. 27, 1968. Pressure rollers and static pressure devices may also be used. While hand rollers which exert about 10–25 pounds/sq.in. were satisfactory where smooth surfaces such as films, glass, metal, etc. are used, in the case of fibrous materials, e.g., uncoated papers, pressures above 100 pounds per square inch are more desirable. Pressures above 10,000 pounds are not necessary and could be harmful to the image.

The processes of this invention offer a simple and economical method of imaging a surface by image transfer. Image transfer by irradiation requires no heat so no thermal distortions of base or receptor arise. Irradiation times can be as short as 15 seconds depending on the optical density of the coating and the nature of the receptor. The transferred images are hard and will not smudge in handling. Little equipment is required to perform the image transfer operation. Image transfer by irradiation offers greater flexibility using photopolymer systems so that the invention is capable of many applications. The process of this invention is particularly useful in color proofing where multiple complementary images of different colors are to be superposed on one receptor. The resulting transfer gives a well defined high contrast multicolor reproduction of the original. The process may also be used for making decalcomanias, surprinting or other situations where it is desirable to transfer or imprint an image on a receptor surface. The invention is also useful in titling films and making transparent slides in a quick and simple manner. Because the polymerized images which are formed are substantially resistant to chemical or solvent attack this invention may also be used in making lithographic offset printing elements and photoresist elements.

The embodiments of the invention in which an exclusive property or privilege is claimed are defined as follows:

1. An image reproduction and transfer process which comprises a. exposing imagewise to actinic radiation a photopolymerizable film element comprising
   1. a removable film support element;
   2. a photopolymerizable layer coated on said support element having a thickness of at least 0.00005-inch and an optical density not more than 0.7 with respect to the actinic radiation, said photopolymerizable layer containing a monomer, present in sufficient amounts to cause a thin film of substantially free monomer to form on the surface of said photopolymerizable layer furtherest from said support element, and
   3. a removable cover sheet element laminated to said photopolymerizable layer and having a higher chemical affinity for exposed photopolymer than said film support, at least one of the removable elements being transparent to the actinic radiation which passes first through the transparent removable element, b. removing the cover sheet with adherent exposed polymerized image areas and laminating the unexposed and unpolymerized coplanar complementary image areas to a receptor surface, having a higher chemical affinity for the exposed photpolymerized image than said film support, and transferring by c. exposing the layer through said removable film support to actinic radiation and stripping said support from the exposed transferred complementary image areas.

2. A process according to claim 1, wherein the photopolymerizable layer contains at least one non-gaseous, ethylenically unsaturated monomer having at least one terminal ethylenic group having a molecular weight of at least 150, nonvolatile at 65°C., and being capable of forming a high polymer by free-radical-initiated, chain-propagated addition polymerization, and an addition polymerization initiator activatable by said actinic radiation, and a thickener, said monomer being present in sufficient amount to cause a thin film of sub-stantially free monomer to form on the surface of the coated photopolymerizable layer upon drying.

3. A process according to claim 1, wherein the support or cover sheet is a flexible macromolecular organic polymer film transparent to actinic radiation and the surface of the receptor has greater affinity for the polymerized image than the support.

4. A process according to claim 2, wherein the monomer is a polyoxyethyltrimethylol triacrylate or trimethacrylate.

5. A process according to claim 2, wherein said photopolymerizable layer contains a particulate microcrystalline thickener having discrete and orderly orientation, and said monomer is a liquid, there being 10–90 parts of thickener per 100 parts, by weight, of monomer-thickener.

6. A process according to claim 5, wherein said thickener is selected from the group consisting of silicas, clays, alumina, bentonites, kaolinites, attapulgites, barium sulfate, and montmorillonites.

7. A process according to claim 2, wherein said photopolymerizable layer contains a organic polymer as a thickener.

* * * * *

PO-1050
(5/69)

UNITED STATES PATENT OFFICE
CERTIFICATE OF CORRECTION

Patent No. 3,785,817 Dated January 15, 1974

Inventor(s) August Dennis Kuchta

It is certified that error appears in the above-identified patent and that said Letters Patent are hereby corrected as shown below:

Page 1, after "[76] Inventor: ...." insert --[73] Assignee: E. I. du Pont de Nemours and Company, Wilmington, Del.--

Column 14, line 5, before the word "triacrylate" insert --propane--.

Signed and sealed this 30th day of April 1974.

(SEAL)
Attest:

EDWARD M.FLETCHER,JR.
Attesting Officer

C. MARSHALL DANN
Commissioner of Patents